(12) United States Patent
Mohtashemi et al.

(10) Patent No.: US 7,893,778 B2
(45) Date of Patent: Feb. 22, 2011

(54) FLEXIBLE LOW CURRENT OSCILLATOR FOR MULTIPHASE OPERATIONS

(75) Inventors: Behzad Mohtashemi, Los Gatos, CA (US); Allen Chang, Fremont, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 63 days.

(21) Appl. No.: 12/488,413

(22) Filed: Jun. 19, 2009

(65) Prior Publication Data

US 2010/0321121 A1  Dec. 23, 2010

(51) Int. Cl.
*H03B 5/24* (2006.01)
*H03K 3/03* (2006.01)
(52) U.S. Cl. ..................... 331/57; 331/177 R
(58) Field of Classification Search .................. 331/57, 331/111, 143, 175, 177 R
See application file for complete search history.

(56) References Cited

U.S. PATENT DOCUMENTS 4,565,976 A * 1/1986 Campbell ................ 331/57

* cited by examiner

*Primary Examiner*—David Mis
(74) *Attorney, Agent, or Firm*—Joshua D. Isenberg; JDI Patent

(57) ABSTRACT

An oscillator includes a reference stage and multiple phase stages. The reference stage has a reference transistor having a gate coupled to a voltage reference and a drain coupled to a reference current source. Each phase stage includes a transistor, two current sources, a capacitor, switch, inverter, and latch. The transistor has a drain coupled to a first current source, a gate coupled to a node and a source coupled to the reference transistor's source. The capacitor and switch couple between the node and ground. The second current source couples to the node. The transistor's drain couples to the inverter's input. The inverter's output couples to the latch's set input. The latch's output couples to the switch. The inverter output also couples to the reset input of a subsequent phase stage's latch. The inverter output for a last stage couples to the reset input of a first stage latch.

21 Claims, 10 Drawing Sheets

FLEXIBLE LOW CURRENT OSCILLATOR FOR MULTIPHASE OPERATIONS

FIELD OF THE INVENTION

This invention generally relates to an electrical circuit for generating a cyclic signal and more particularly to a flexible oscillator with low transistor count, ability to oscillate to very high frequency, and low current consumption, which can be used in multiphase operations.

BACKGROUND OF THE INVENTION

Within nearly every electronic subsystem is some form of waveform generator that produces cyclical waveforms. The waveform generator is oftentimes referred to as an oscillator. Depending on the application, an oscillator can be used to source regularly spaced pulses or clock signals. Oscillators are oftentimes rated depending on their stability and accuracy, frequency adjustability (i.e., tunability), gain of active circuit, start-up time, power consumption, etc.

A type of oscillator commonly known as a relaxation oscillator is the most commonly used architecture for lower frequency oscillator designs. FIG. 1A is an electrical schematic diagram illustrating an example of a conventional relaxation oscillator. As shown in FIG. 1A, a relaxation oscillator 100 includes a capacitor $C_{10}$, a switching device $SW_{10}$ such as a field effect transistor, a comparator 102, a current source $I_{10}$ and a one-shot timer 104.

A voltage reference $V_{Ref}$ is connected to the − input of the comparator 102. A first terminal of the capacitor $C_{10}$ is connected to the + input of the comparator 102. The second terminal of the capacitor $C_{10}$ is grounded. The output of the comparator 102 is electrically connected to the input of the one-shot timer 104, the output of which is electrically coupled to a control terminal of the switch device $SW_{10}$. The switch device $SW_{10}$ is electrically connected between the first terminal of the capacitor $C_{10}$ and ground and is used for discharging the frequency-determining capacitor $C_{10}$. As shown in the voltage versus time graph of FIG. 1B, the voltage on the capacitor is more or less saw-toothed in shape with a short flat spot 101 between successive saw-teeth.

For these particular oscillators, the frequency is limited by the speed of the comparator 102. As current from the source $I_{10}$ charges the capacitor $C_{10}$ the voltage at the (+) input of the comparator 102 eventually reaches the reference voltage $V_{Ref}$ and turns on comparator 102. That triggers the one shot 104 to open the switch $SW_{10}$, which discharges the capacitor $C_{10}$ and sets the voltage back to zero. The one shot 104 keeps the switch $SW_{10}$ on long enough to completely discharge the capacitor $C_{10}$ so that the output is not erratic. In order to ensure that the capacitor $C_{10}$ completely discharges, there will be a delay time 101 between successive saw-teeth.

For low frequency, delay times in the comparator 102 are relatively small. But if switching is to be done at high frequency, the delay time becomes large with respect to each saw-tooth cycle. Also, at high frequency, e.g. 5 MHz, a high switching current, e.g., 1 mA is needed. The current source that charges up the capacitor $C_{10}$ coupled to the one shot 104 increases as the input voltage increases. So, for example, at 5.0V the current source $I_{10}$ may be able to deliver 5 µA, and at 2.5 it can deliver only 1 µA. Thus, at 5.0V, for example, the capacitor charges up 5 times faster than at 2.5V. So, at 5.0V, the flat response is much less than what it is at 2.5V. In a low frequency where switching frequency is at 500 KHz, it might not be a problem for the one shot 104 to vary from 50 ns to 70 ns, but in a high frequency oscillation, e.g., greater than 3 MHz, it matters very much to have variations from 50 ns, to 100 ns.

Since one shot properties vary with supply voltage, the flat spot between sawtooth waves changes with supply voltage and also varies with temperature, which is not desirable. As a result, relaxation oscillators are only good for frequencies of about 1 MHz and below. In addition, these oscillators are not well suited for multiphase systems. In a conventional multiphase system, each phase need its own particular oscillator and comparator. Furthermore, the conventional comparator is not cheap and the oscillator consumes a lot of current. High current consumption is undesirable in many applications, such as portable devices.

It is within this context that embodiments of the present invention arise.

DESCRIPTION OF THE SPECIFIC EMBODIMENTS

Figure 1A:
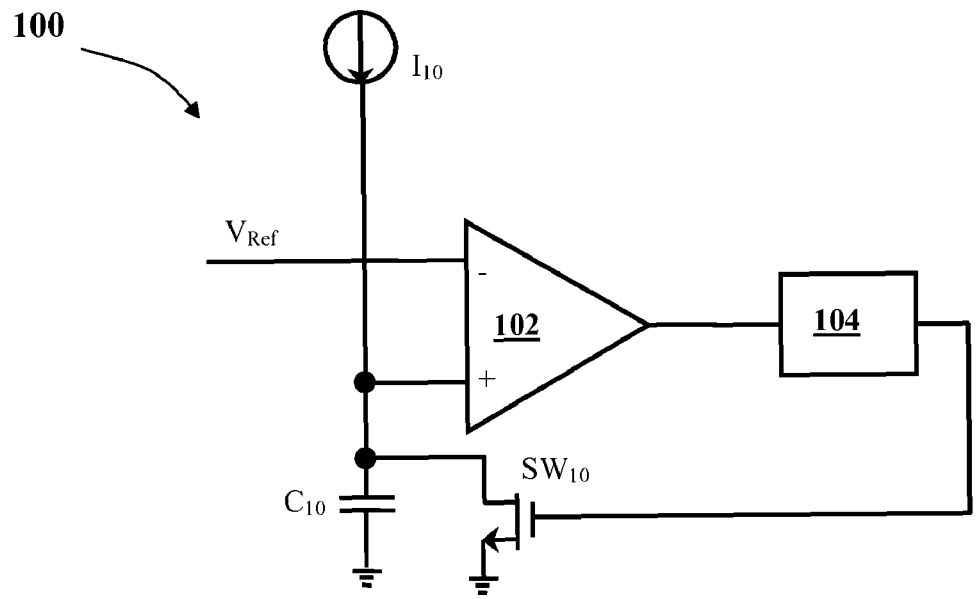
FIG. 1A is a circuit diagram of a conventional relaxation oscillator.

Embodiments of the present invention are directed to oscillators that overcome the disadvantages associated with prior art relaxation oscillators. Oscillator designs in accordance with embodiments of the present invention eliminate the need for a conventional comparator. The oscillator is generally comprised of one or more differential input stages that may have as many input stages as the number of phases needed with a small number of active components. Each differential stage acts as a maximum selector stage. As used herein, the term "maximum selector" refers is a circuit having multiple input stages (sometimes referred to herein as "phase stages") that chooses the maximum voltage of the voltages of the different input stages. Selection of a given input stage by the maximum selector causes an output of the selected input stage to change. The current supplied to a given input stage may be varied as the oscillator's needs change. For example, a negative feedback loop coupled to the reference stage may be configured to detect a current need of the oscillator and provide an appropriate supply current to each input stage to meet the detected current need.

According to an embodiment of the invention, an oscillator apparatus may comprise a reference stage and two or more phase stages including a first stage and a last stage. The reference stage has a reference current source and a first reference transistor having a gate coupled to a voltage reference and a drain coupled to the reference current source. By way of example, and not by way of limitation, each of the phase stages may include a transistor, first and second current sources, a capacitor, a switch, and a logic block. The transistor has a drain coupled to the first current source, a gate coupled to a node and a source coupled to a source of the reference transistor in the reference stage. The capacitor has a first terminal coupled to the node and a second terminal connected to ground. The switch is coupled between the first and second terminals of the capacitor. The second current source is coupled to the node.

Basically, the logic block for a given phase stage is used to latch on the switch for that phase stage, and reset the switch for the next phase stage. In other words, when a phase stage is selected by the maximum selector, the logic block deactivates the selected phase stage, and activates the next phase stage (which corresponds to the next phase of the oscillator). The logic block for each phase stage may be formed in many different ways. An example of a logic block is shown which includes an inverter and a set-reset latch. An input of the inverter for a given phase stage is coupled to the drain of the transistor for that phase stage. The output of the inverter for a given phase stage is coupled to a set input for the latch for that phase stage. An output of the latch for a given phase stage is coupled to the switch for that phase stage. The output of the inverter for a given phase stage is also coupled to the reset input of the set-reset latch in a subsequent phase stage. The output of the inverter for the last stage is coupled to the reset input of the set-reset latch in the first stage.

Figure 2A:
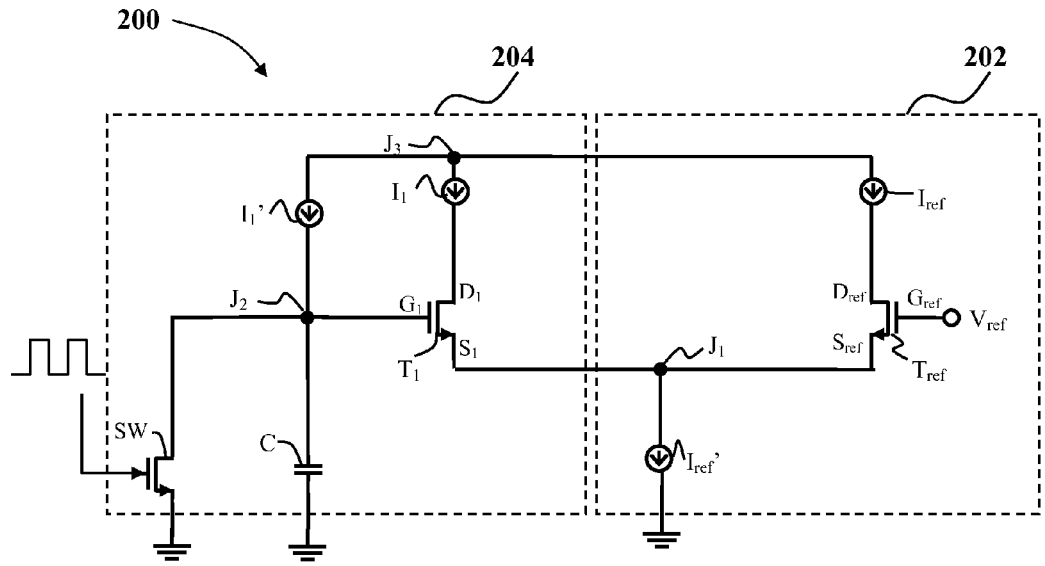
FIGS. 2A-2B are circuit diagrams illustrating the principles of operation of the oscillators and the reference stage according to embodiments of the present invention.

FIG. 2A is a circuit diagram illustrating an input stage (or phase stage) of a phase oscillator 200. As shown in FIG. 2A, the oscillator 200 includes a reference stage 202 and a phase stage 204. The reference stage 202 includes a reference field effect transistor $T_{ref}$ having a drain $D_{ref}$ electrically coupled to a first reference current source $I_{ref}$, gate $G_{ref}$ electrically connected to a voltage reference $V_{ref}$ and a source $S_{ref}$ coupled to an input of a second reference current source $I_{ref}'$, which may supply a reference current of up to, e.g., about twice the current supplied by the first reference current source $I_{ref}$. By way of example, the reference transistor $T_{ref}$ may be a metal oxide semiconductor (MOS) device. By way of example, the first reference current source $I_{ref}$ may supply a current of about 1 uA and the second reference current source $I_{ref}'$ may supply a current of about 2 uA and the reference voltage $V_{ref}$ may be about 1.2 volts.

The phase stage 204 also includes a transistor $T_1$ having a source $S_1$, a gate $G_1$, and a drain $D_1$. The source $S_1$ is connected to the source $S_{ref}$ of the reference transistor $T_{ref}$ at a first junction $J_1$. The gate $G_1$ is coupled to a second junction $J_2$ and the drain $D_1$ is connected to the output of a current source $I_1$ that supplies a current roughly the same as the current supplied by the first reference current source $I_{ref}$. The oscillator 200 also includes a capacitor C having a first terminal connected to the junction $J_2$ and a second terminal that is grounded. The oscillator 200 also includes a switch SW that permits current to flow between the second junction $J_2$ and ground to discharge capacitor C when a control electrode of the switch SW receives an input trigger signal. Input sides of current sources $I_{ref}$, $I_1$ and a third current source $I_1'$ are coupled to a third junction $J_3$. The output of the third current source $I_1'$ is coupled to the junction $J_2$.

Operation of the oscillator 200 may proceed as follows. Suppose initially, the trigger signal turns switch SW on, therefore the transistor $T_1$ is off since the gate $G_1$ is coupled to ground. The transistor $T_{ref}$ is on due to the reference voltage $V_{ref}$ applied to the gate $G_{ref}$ of the reference transistor $T_{ref}$. The larger current from the second reference source $I_{ref}'$ pulls the drain $D_{ref}$ of the reference transistor $T_{ref}$ down, but the smaller current from the source $I_1$ pulls up the drain $D_1$ of transistor $T_1$.

After the switch SW is turned off, the current from the third current source $I_1'$ charges up the capacitor C and slowly turns the transistor $T_1$ on and the reference transistor $T_{ref}$ off as the gate $G_1$ of the transistor $T_1$ goes above the reference voltage $V_{ref}$. The current source $I_{ref}'$ pulls down the voltage at the drain $D_1$ of the transistor $T_1$ and pulls up the voltage at the first junction $J_1$ and at the drain $D_{ref}$ of the reference transistor $T_{ref}$. This situation remains until the switch SW turns on again. Digital output signals may be obtained from the voltages at the drains $D_1$ and $D_{ref}$ of the transistors $T_1$ and $T_{ref}$. In order for the oscillator to operate at a relatively high rate, the current from the second reference current source $I_{ref}'$ should be relatively large, as discussed above.

Figure 2B:
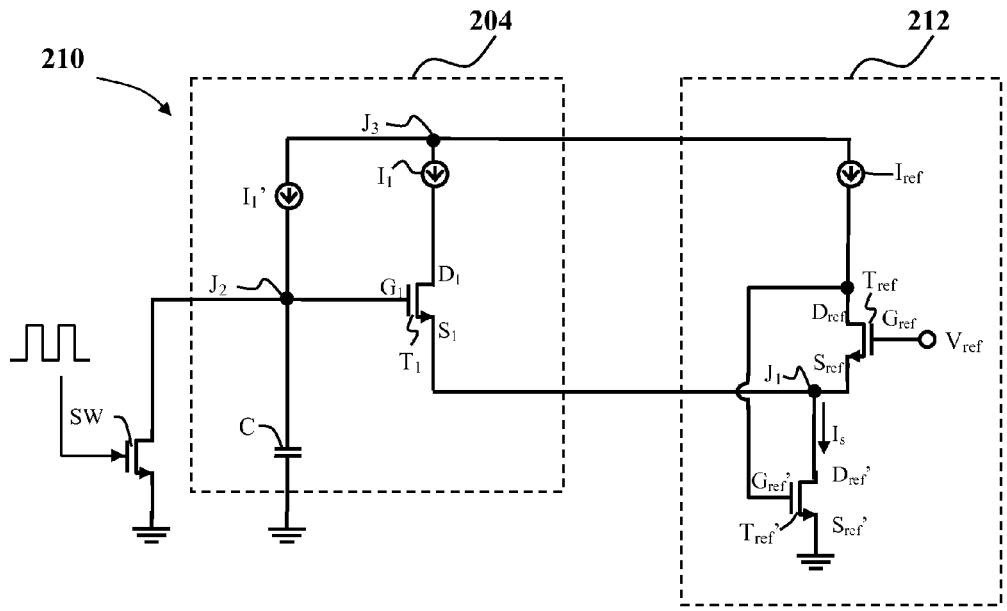

Alternatively, instead of using a constant current $I_{ref}'$, a current control may use negative feedback based on the voltage between the first reference source $I_{ref}$ and the reference transistor $T_{ref}$ (which may be referred to as the first reference transistor) may be used to control the current from the transistor $T_1$ through the junction $J_1$. For example, FIG. 2B is an electrical diagram of an alternative oscillator 210, that is a variation on the oscillator 200 shown in FIG. 2A. In addition to the components described above with respect to FIG. 2A, a reference stage 212 of the oscillator 210 includes a current control in the form of second reference transistor $T_{ref}'$ (e.g., a MOS transistor) having a drain $D_{ref}'$ coupled to first junction $J_1$, a gate $G_{ref}'$ coupled to the drain $D_{ref}$ of first reference transistor $T_{ref}$ and a source $S_{ref}'$ connected to ground. It is noted that in this example illustrated in FIG. 2B, the reference transistor $T_{ref}'$ is an N-type (or n-channel) device. Alternatively, the reference transistor $T_{ref}'$ may be a P-type (or p-channel) device, in which case the source $S_{ref}'$ may be coupled to a common voltage $V_{cc}$. The first reference current source $I_{ref}$ acts as a fixed reference current source. If the voltage at junction $J_1$ goes high (e.g., when $T_1$ turns on) the drain $D_{ref}$ of first reference transistor $T_{ref}$ and gate $G_{ref}'$ of the second reference transistor $T_{ref}'$ to be pulled high, which turns the second reference transistor $T_{ref}'$ more on which increases the supply current $I_s$ and pulls junction $J_1$ back down. Without the negative feedback, an increase of voltage at junction $J_1$ would cause the first reference transistor $T_{ref}$ to turn off because its gate-to-source voltage (i.e., $V_{ref}$ minus the voltage at junction $J_1$) decreases. Conversely, if the voltage at junction $J_1$ goes low it pulls the gate $G_{ref}'$ of the transistor $T_{ref}'$ low, which pulls the junction $J_1$ back up. If the second reference transistor $T_{ref}'$ cannot supply sufficient current, it pulls up the voltage at the drain $D_{ref}$ of the transistor $T_{ref}$ and at the junction $J_1$ which causes the second reference transistor $T_{ref}'$ to open more until it provides the appropriate supply current $I_s$. This way, the first reference transistor $T_{ref}$ is always on and allows the current supplied by supply $I_{ref}$ to go through, no matter what the input is from transistor $T_1$. The second reference transistor $T_{ref}'$ changes the amount of current it allows through such that the value of current source $I_{ref}$ always flows through reference transistor $T_{ref}$. As a result of $I_{ref}$, $T_{ref}$, and $T_{ref}'$, there is a negative feedback in the circuit of FIG. 2B. Because of this negative feedback, the supply current $I_s$ of the circuit 210 changes to meet the current demand of the system.

The secondary reference transistor $T_{ref}'$ acts as a variable resistor that throttles the current of the reference current source $I_{ref}$ in a negative feedback manner in response to changes in the current through junction $J_1$. Alternatively, another device capable of delivering a negative feedback loop such as an operational amplifier or variable resistor may be used as the current control to adjust the supply current $I_s$ in response to changes in the voltage at junction $J_1$ to provide the desired negative feedback control of the current through the junction $J_1$.

Figure 3A:
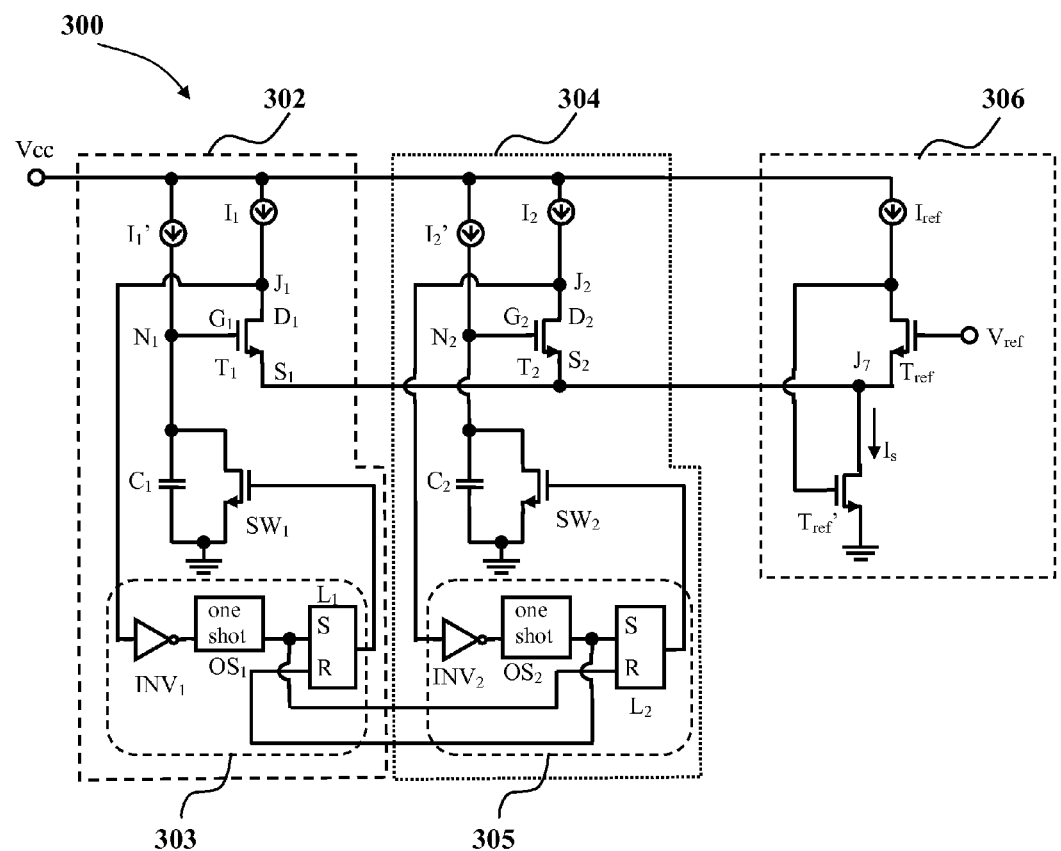
FIG. 3A is a circuit diagram of an NMOS two phase oscillator according to an embodiment of present invention.

Two or more phase stages of the type shown in FIG. 2A, 2B may be combined together with a reference block of the type shown in FIG. 2B to provide a multiple phase oscillator according to an embodiment of the present invention. By way of example, and not by way of limitation, FIG. 3A is an electrical diagram illustrating a two phase oscillator 300 according to an embodiment of the present invention. As shown in FIG. 3A, the oscillator 300 includes two phase stages 302, 304 and one reference stage 306. The reference stage 306 is similar to the reference stage 212 of the oscillator 210 described above in FIG. 2B.

By way of example, the first phase stage 302 may include a n-type MOS transistor $T_1$ having a drain $D_1$ coupled to a current source $I_1$, which may supply a current of about 1 uA through a junction $J_1$, a gate $G_1$ coupled to a first node $N_1$, and a source $S_1$ coupled to a junction $J_7$ of the reference stage 306. The first phase stage 302 also includes a capacitor $C_1$ having a first terminal coupled to secondary current source $I_1'$ through the first node $N_1$ and a second terminal is connected to the ground. A switch $SW_1$, which can be an n-type MOS transistor, is connected in parallel to the capacitor $C_1$ with a source grounded and having a gate coupled to an output of a latch $L_1$. The first phase stage 302 may further include a logic block 303 which includes an inverter $INV_1$ having an input coupled to the transistor $T_1$ at the junction $J_1$ and an output coupled to an input of the latch $L_1$. A one-shot timer $OS_1$ may be optionally coupled between the inverter $INV_1$ and the latch $L_1$. In such a case, the output of the inverter $INV_1$ may be regarded as being indirectly coupled to the latch $L_1$. The logic block shown here is only an example and may be replaced with a similarly functioning circuit block.

The second phase stage 304 includes similar components as the first phase stage 302. The second phase stage 304 may include a n-channel MOS transistor $T_2$ having a drain $D_2$ coupled to a current source $I_2$ of about 1 uA through a junction $J_2$, a gate $G_2$ coupled to secondary current source $I_2'$ through a second node $N_2$, and a source $S_2$ coupled to the junction $J_7$. The second phase stage 304 also includes a capacitor $C_2$ that is of equal capacitance to the capacitor $C_1$. The capacitor $C_2$ has a first terminal coupled to the second node $N_2$ and a second terminal is connected to the ground. A switch $SW_2$, which can be a n-channel MOS transistor, is coupled to the capacitor $C_2$, and includes a source connected to the ground and a gate coupled to an output of a latch $L_2$. The second phase stage 304 may further include a logic block 305 which includes an inverter $INV_2$ having an input coupled to the transistor $T_2$ at the junction $J_2$ and an output coupled to an input of the latch $L_2$. A one-shot timer $OS_2$ is optionally coupled between the inverter $INV_2$ and the latch $L_2$. The one-shot timers $OS_1$, $OS_2$ provide digital output signals if needed.

The reference stage 306 may operate in a manner similar to that of reference stage 212 as described above with respect to FIG. 2B. The reference stage 306 may operate with or without feedback control of the current. In the example shown in FIG. 3A, the second reference transistor $T_{ref}'$ provides negative feedback control of the current through the junction $J_7$ from the transistors $T_1$, $T_2$, and $T_{ref}$.

As shown in FIG. 3A, the output of the one-shot timer $OS_1$ is connected to the set input S of the latch $L_1$ and to the Reset input R of the latch $L_2$. Similarly, the output of one-shot timer $OS_2$ is connected to a Set input S of the latch $L_2$ and a Reset input R of the latch $L_1$. It is noted that if the one-shot timers are not used, the outputs of the inverters $INV_1$, $INV_2$ would be coupled directly to the latches.

The circuit 300 operates as a maximum selector that chooses as its output the maximum of the voltages of the phase stages 302, 304. In the example depicted in FIG. 3A, there are three voltages in the system, $V_{ref}$, and the voltages at nodes $N_1$, $N_2$ (referred to as $V_{n1}$, and $V_{n2}$, respectively). The architecture shown in FIG. 3A always picks the largest of the voltages $V_{n1}$, and $V_{n2}$ and $V_{ref}$. For example, if initially $V_{ref}$ is 1.2V, and both $N_1$ and $N_2$ are at 0 volts. As soon as either $V_{n1}$ or $V_{n2}$ has risen above $V_{ref}$, it is recognized by the architecture shown and it will be selected. For example, if $V_{n2}$ has risen above $V_{ref}$, then phase stage 304 is selected, and the transistor $T_2$ turns on. Because of the negative feedback in the reference stage 306, the reference transistor $T_{ref}$ still stays on as will be explained below. With the transistor $T_2$ on, the voltage at $J_1$ is pulled low, which triggers the logic unit 305.

The supply current $I_s$ is not fixed and it varies with the need of the system. In FIG. 3A, the arrangement of $T_{ref}$ and $T_{ref}'$ provides a negative feedback, which means it will supply the required current for the intended architecture. The negative feedback ensures that $T_{ref}$ always allows the value of the reference current source $I_{ref}$ through, but also adjusts to provide the demand for current from the rest of the system. For example, when phase stage 304 is selected, the second reference transistor $T_{ref}'$ allows the supply current $I_s$ through in the amount of $I_{ref}$ plus $I_2$. However, when either of the transistors shown, $T_1$ or $T_2$, turns on, there are parasitic capacitances that must be charged before these transistors can turn on. So the more current available, the faster these capacitances can be charged up and the quicker the transistors can turn on. During that transient, the supply current $I_s$ will be increased due to the negative feedback on $T_{ref}'$. The negative feedback detects the current demand of the system, and provides the supply current $I_s$ accordingly. Thus the negative feedback enables a more efficient, robust, and faster oscillator circuit. No matter how many stages are used, and what the transient current demand is, the negative feedback ensures that the appropriate supply current $I_s$ is provided.

Figure 3B:
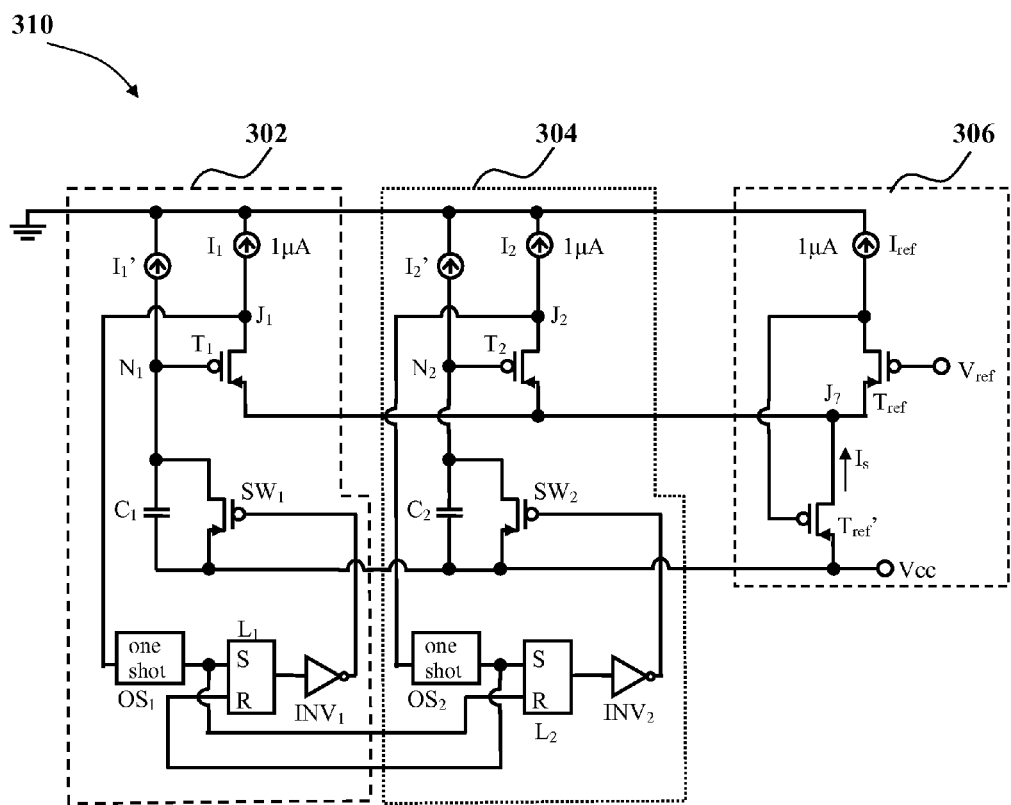
FIG. 3B is a circuit diagram of a PMOS two phase oscillator according to an embodiment of present invention.

FIG. 3B is an electrical diagram showing an alternative two phase oscillator 310, which includes similar components as the oscillator 300, except the transistors $T_1$, $T_2$, $T_{ref}$ and $T_{ref}'$ and the switches $SW_1$ and $SW_2$ are p-channel MOS transistors. In this embodiment, the second terminals of the capacitors $C_1$, $C_2$, the sources of the switches $SW_1$, $SW_2$ and the source of the secondary reference transistor $T_{ref}'$ are coupled to a voltage Vcc instead of grounded. In other words, the positions of the Vcc and the ground are switched and so are the directions of the current sources $I_1$, $I_1'$, $I_2$, $I_2'$ and $I_{ref}$ in circuit 310, as compared to circuit 300 of FIG. 3A. In the logic portion of each phase stage for two phase oscillator 310, the inverter is placed between the latch and the switch, rather than between the one shot and the junction (e.g., $J_1$).

Speed of oscillation of the oscillators 300 and 310 is regulated by the amount of current provided by current sources $I_1'$, $I_2'$, and size of the capacitors $C_1$, $C_2$. The oscillators 300 and 310 can be used in dual phase converters.

The oscillators 300, 310 may operate as follows. At an initial state the switch $SW_1$ is off and the switch $SW_2$ is latched on by latch $L_2$. As a result, the transistor $T_2$ is off. Initially, the voltage at node $N_1$ is low, so transistor $T_1$ is also off. Current from source $I_1'$ charges the capacitor $C_1$ from 0 to a reference voltage $V_{ref}$ (e.g., 1.2 V). The capacitor $C_1$ charges up and when it reaches $V_{ref}$ that stage is selected by the maximum selector and the transistor $T_1$ turns on. Current from the source $I_1$ pulls up the voltage at $J_7$, which causes the negative feedback loop to turn on secondary reference transistor $T_{ref}'$ more in order to compensate the additional current. With the current flowing through $T_{ref}'$ higher than the current supplied by supply $I_1$, the voltage at the drain $D_1$ of the transistor $T_1$ is pulled down, which pulls the input of the inverter $INV_1$ low. As a result, the output of the inverter $INV_1$ is high, which sets the latch $L_1$ and resets the latch $L_2$. This turns on the switch $SW_1$ and turns off the switch $SW_2$.

Similarly, when the switch $SW_2$ is off (and switch $SW_1$ is latched on), the current source $I_2'$ is charging the capacitor $C_2$ from 0 to $V_{ref}$ (e.g., 1.2 V). When the voltage on the capacitor $C_2$ reaches $V_{ref}$, the transistor $T_2$ turns on. The reference transistor $T_{ref}'$ supplies more current than the source $I_1$ so that pulls drain $D_2$ of the transistor $T_2$ down. The input of the $INV_2$ goes low and the output of $INV_2$ goes high, which sets the latch $L_2$, turning on the switch $SW_2$ and resetting the latch $L_1$. The output of the latch $L_1$ therefore goes low and the switch $SW_1$ turns off.

Figure 1B:
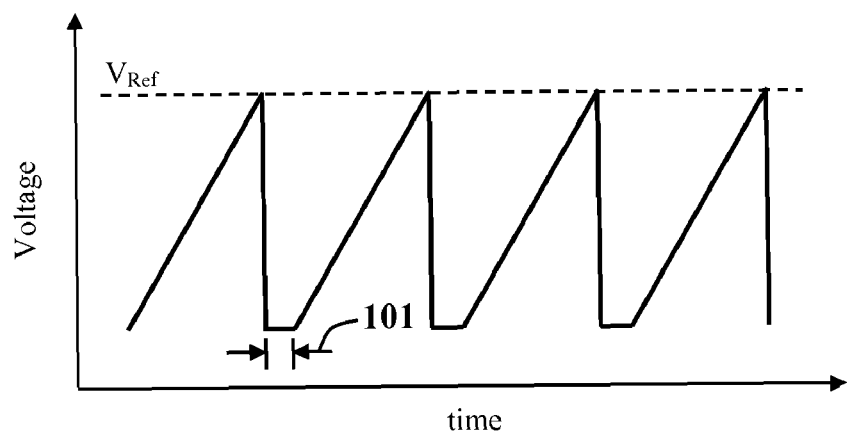
FIG. 1B shows a signal profile of the circuit of FIG. 1A.
Figures 3C, 3D, 3E:
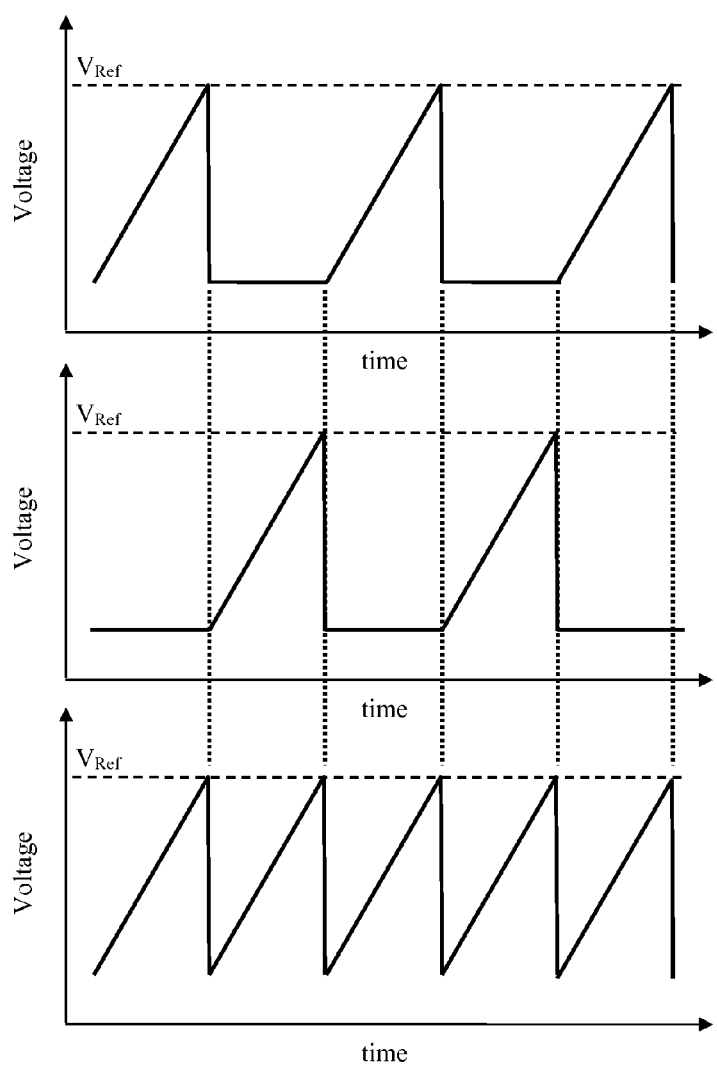
FIGS. 3C-3D show signal profiles at nodes $N_1$ and $N_2$ in the electrical circuits of the type shown in FIGS. 3A-3B respectively.
FIG. 3E shows the combined signal profiles of nodes $N_1$ and $N_2$.

As may be seen from the foregoing, when the voltage at node $N_2$ turns on transistor $T_2$, the voltage at $N_1$ is turns off transistor $T_1$ and vice versa. Consequently, the oscillator 300 or 310 can produce oscillation signals in two different phases. FIGS. 3C-3D show simulated signal profiles at nodes $N_1$ and $N_2$ in the electrical circuits shown in FIGS. 3A-3B operating at 33.3 MHz. As shown in the figures, the sawtooth waveforms are 180 degrees apart. FIG. 3E shows the two sawtooth waveforms of FIGS. 3C-3D combined together. Note that because there are two input stages, the capacitor for one stage can begin charging as soon as the capacitor for the other stage starts to discharge. Thus there is no need to wait for the capacitor to fully discharge before starting the next cycle, and the delay time 101 of FIG. 1B is eliminated. The one shot timers in this invention are optional and are only used to help provide digital signals. They do not interfere with the timing of the circuit.

Figure 3F:
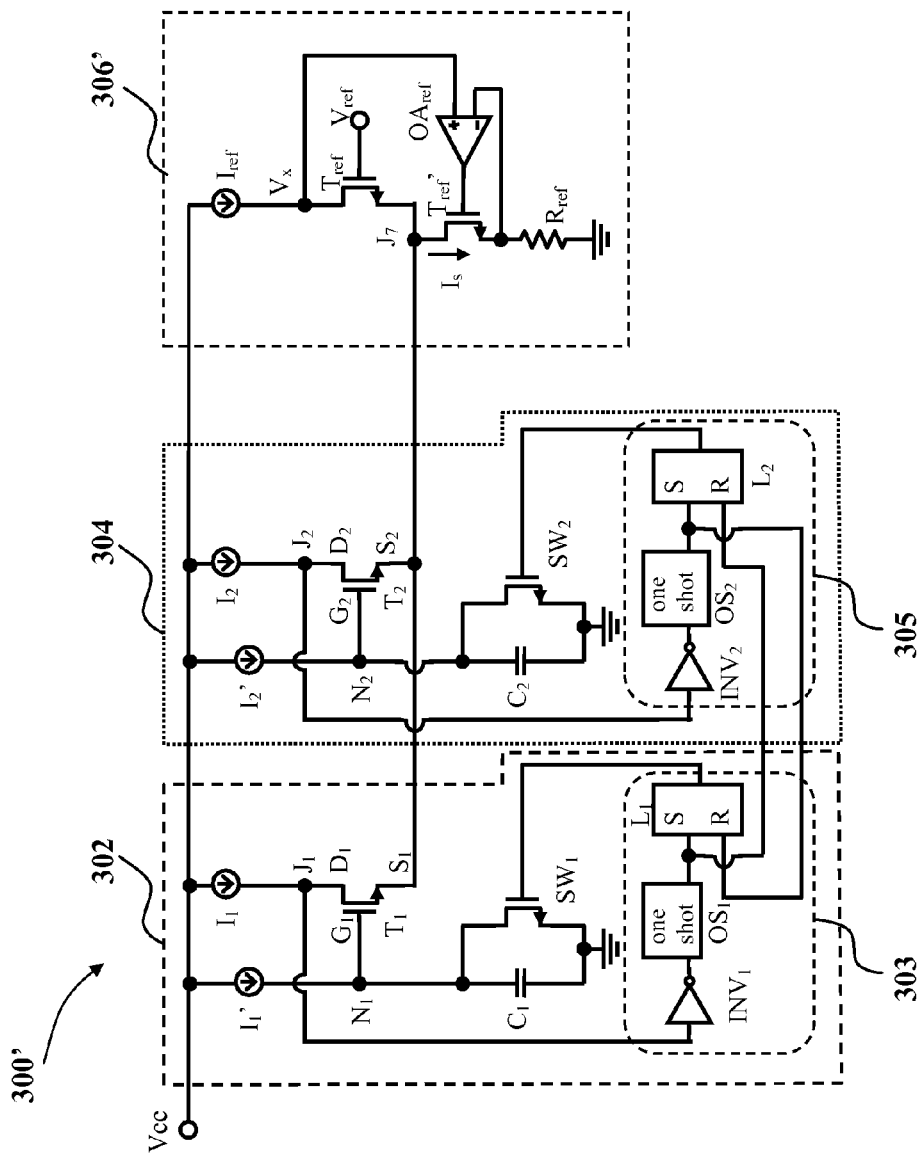
FIG. 3F shows a circuit diagram of a NMOS two phase oscillator with an alternative reference stage.

Alternatively, the second reference transistor $T_{ref}'$ may be replaced by a current source such as $I_{ref}'$ of FIG. 2A, however this embodiment would not have negative feedback. In another alternative embodiment, as shown in the circuit 300' of FIG. 3F, the negative feedback for the reference stage 306' may further include an op amp $OA_{ref}$ and a resistor $R_{ref}$. The resistor $R_{ref}$ is connected in series between the source of second reference transistor $T_{ref}'$ and ground. The output of the op amp $OA_{ref}$ is connected to the gate of second reference transistor $T_{ref}'$, one input of op amp $OA_{ref}$ is connected between second reference transistor $T_{ref}'$ and resistor $R_{ref}$, and the other input of op amp $OA_{ref}$ is connected to drain of first reference transistor $T_{ref}$ having potential V. The supply current $I_s$ flowing through second reference transistor $T_{ref}'$ is equal to $I_s = V_x/R_{ref}$. As with the circuit 300 of FIG. 3A, the negative feedback detects the oscillator current need, and provides the appropriate supply current L. Otherwise the circuit 300' is the same as the circuit 300 of FIG. 3A.

Figure 4A:
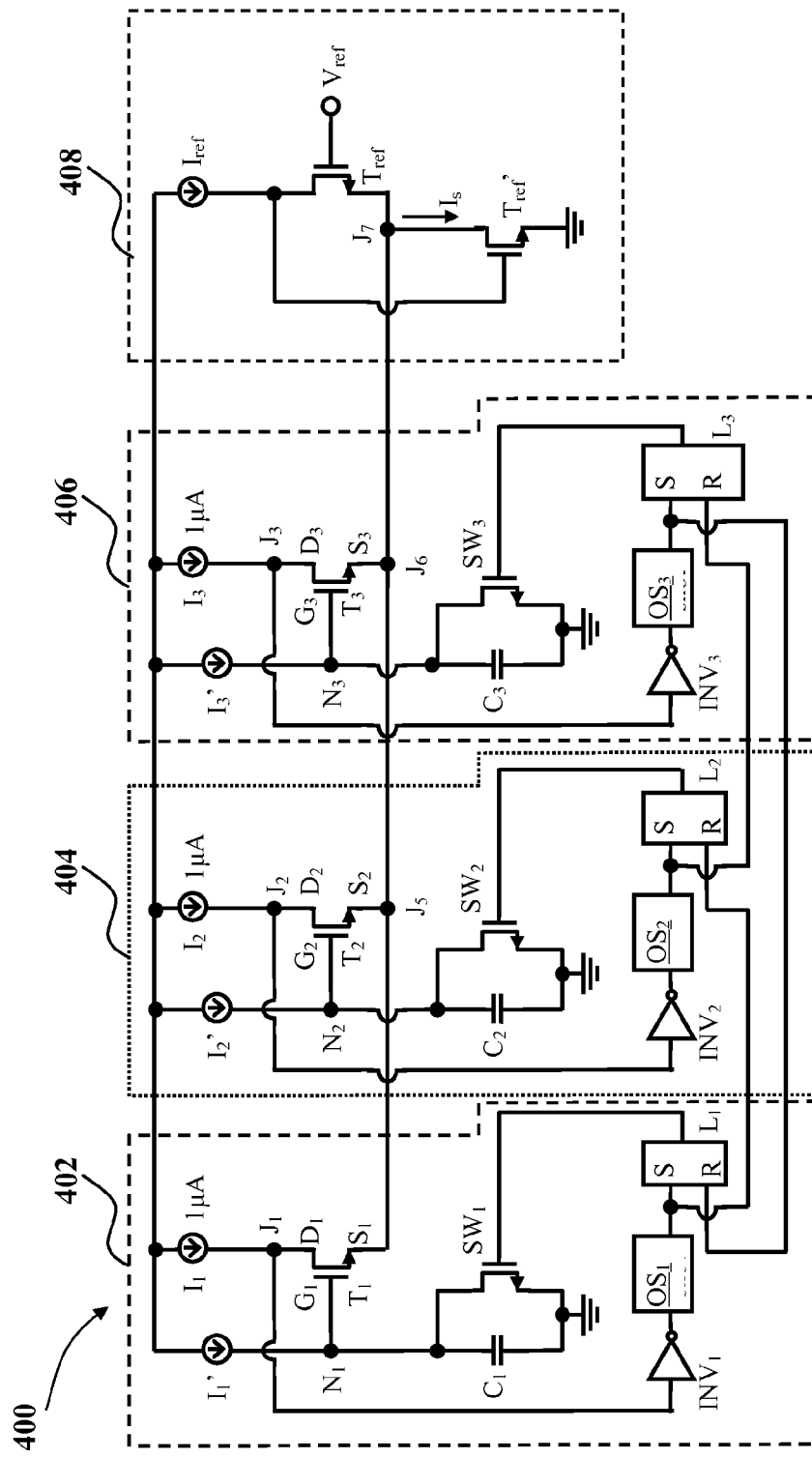
FIG. 4A is a circuit diagram of a three phase oscillator according to an embodiment of the present invention.

The oscillator depicted in FIGS. 3A, 3B may be extended to any number of phases simply by adding more phase stages. By way of example, and not by way of limitation, a three phase oscillator can be made by adding another phase module to the circuit of the two phase oscillator of the type depicted in FIGS. 3A-3B. FIG. 4A is an electrical diagram illustrating a three phase oscillator 400. Such an oscillator may be used, e.g., in a three phase voltage converter. The oscillator 400 includes three phase stages 402, 404, 406 and one reference stage 408. The reference stage 408 is similar to the reference stage 212 of the oscillator 210 described above in FIG. 2B, which includes two reference transistors $T_{ref}$ and $T_{ref}'$. The second reference transistor $T_{ref}'$ is configured as described above to provide negative feedback control of the current through first reference transistor $T_{ref}$ regardless of the current from the transistors of the phase stages.

The first and second phase stages 402 and 404 are similar to the first and second phase stages 302 and 304 of the two phase oscillator 300 as described in FIG. 3A. The first phase stage 402 may include a n-channel MOS transistor $T_1$ having a drain $D_1$, a gate $G_1$ and a source $S_1$. The drain $D_1$ is coupled to a current source $I_1$ of, e.g., about 1 uA through a junction $J_1$. The gate $G_1$ is coupled to a first node $N_1$. The source $S_1$ is coupled to junction $J_5$ in the second phase stage 404, a junction $J_6$ in the third phase stage 406 and connected to a junction $J_7$ in the reference stage 408. The first phase stage 402 also includes a capacitor $C_1$ having a first terminal coupled to secondary current source $I_1'$ through the first node $N_1$ and a second terminal is connected to the ground. A switch $SW_1$, which can be a MOS transistor, is coupled to the capacitor $C_1$ with a source grounded and having a gate coupled to an output of a first latch $L_1$. The first phase stage 402 may further include a first inverter $INV_1$ having an input coupled to the current source $I_1$ at the junction $J_1$ and an output coupled to an input of the first latch $L_1$. A one-shot timer $OS_1$ may optionally be coupled between the first inverter $INV_1$ and the first latch $L_1$.

The second phase stage 404 includes a MOS transistor $T_2$ having a drain $D_2$ coupled to a current source $I_2$ of, e.g., about 1 uA through a junction $J_2$, a gate $G_2$ coupled to secondary current source $I_2'$ through a second node $N_2$, and a source $S_2$ coupled to the junction $J_5$. The second phase stage 404 also includes a capacitor $C_2$ having a first terminal coupled to the second node $N_2$ and a second terminal is connected to the ground. A switch $SW_2$, which can be a MOS transistor, is coupled to the capacitor $C_2$, and includes a source connected to the ground and a gate coupled to an output of a second latch $L_2$. The second phase stage 404 may further include a second inverter $INV_2$ having an input coupled to the current source $I_2$ at the junction $J_2$ and an output coupled to an input of the second latch $L_2$. A one-shot timer $OS_2$ may optionally be coupled between the second inverter $INV_2$ and the second latch $L_2$.

The third phase stage 406 includes a MOS transistor $T_3$ having a drain $D_3$, gate $G_3$, and a source $S_3$. The drain $D_3$ is coupled to a current source $I_3$ of, e.g., about 1 uA through a junction $J_3$. The gate $G_3$ is coupled to secondary current source $I_3'$ through a third node $N_3$. The source $S_3$ is coupled to the junction $J_6$. The third phase stage 406 also includes a capacitor $C_3$ of equal capacitance to the capacitors $C_1$, $C_2$. The period for each phase is determined by the values of the secondary current sources $I_1'$, $I_2'$, $I_3'$, and of the capacitors $C_1$, $C_2$, $C_3$ since they determine how fast the voltage across the capacitors increase. For a symmetrical oscillator with equal phases, the values of the current sources and of the capacitors should be equal. However, if unequal phases are desired, those values may be altered accordingly. The capacitor $C_3$ has a first terminal coupled to the third node $N_3$ and a second terminal is connected to the ground. A switch $SW_3$, which can be a MOS transistor, is coupled to the capacitor $C_3$, and includes a source connected to the ground and a gate coupled to an output of a third latch $L_3$. The third phase stage 406 may further include a third inverter $INV_3$ having an input coupled to the current source $I_3$ at the junction $J_3$ and an output coupled to an input of the third latch $L_3$. A one-shot timer $OS_3$ may optionally be coupled between the third inverter $INV_3$ and the third latch $L_3$.

In general, it is not necessary for the reference current $I_{ref}$ to be equal to $I_1$, $I_2$, and $I_3$. It is also not also necessary for $I_1'=I_2'=I_3'$. However, if a symmetrical oscillator is desired, then the secondary current sources should be equal, $I_1'=I_2'=I_3'$, as should be the capacitances of capacitors $C_1=C_2=C_3$.

As shown in FIG. 4A, the output of the one-shot timer $OS_1$ is connected to a set S of the latch $L_1$ and a reset R of the latch $L_2$. The output of the one-shot timer $OS_2$ is connected to a set S of the latch $L_2$ and a reset R of the latch $L_3$. The output of the one-shot $OS_3$ is connected to a set S of the latch $L_3$ and a reset R of the latch $L_1$. The one-shot timers $OS_1$, $OS_2$, $OS_3$ can provide digital output signals if needed. If the one-shot timers $OS_1$, $OS_2$, $OS_3$ are not used, the outputs of the inverters $INV_1$, $INV_2$, $INV_3$ may be directly coupled to the latches.

The reference stage 408 may operate in a manner similar to that described above with respect to FIG. 2B. The reference stage 408 may operate with or without feedback control of the current. In the example shown in FIG. 4A, the second reference transistor $T_{ref}'$ provide negative feedback control of the current through the junction $J_7$ from the transistors $T_1$, $T_2$, $T_3$, and $T_{ref}$.

The speed of oscillation of the oscillator 400 is regulated by the current supplied by sources $I_1'$, $I_2'$, $I_3'$ and size of capacitors $C_1$, $C_2$, $C_3$. The oscillator 400 may operate as follows. At an initial stage, the switch $SW_1$ is off and the switches $SW_2$ and $SW_3$ are on. The voltage at the first node $N_1$ is ramped up by the current from the current source $I_1'$ until it reaches the reference voltage $V_{ref}$, which turns on transistor $T_1$ and pulls the drain $D_1$ of transistor $T_1$ down. This sets the latch $L_1$ and resets the latch $L_2$. Therefore the switch $SW_1$ turns on and the switch $SW_2$ turns off; the switch $SW_3$ remains latched on.

Similarly, with switch $SW_2$ off, when the voltage at the node $N_2$ goes above $V_{ref}$ due to the current from the source $I_2'$, the drain $D_2$ of MOS transistor $T_2$ is pulled down. This sets the second latch $L_2$ and resets the third latch $L_3$. As a result, the second switch $SW_2$ turns on and the third switch $SW_3$ turns off. When the voltage at the node $N_3$ goes above $V_{ref}$ as a result of the current from the current source $I_3'$, the voltage on the drain $D_3$ of the transistor $T_3$ is pulled down. This sets the latch $L_3$ and resets the latch $L_1$. As a result, the switch $SW_3$ turns on and the switch $SW_1$ turn off, which is back to the initial stage. The three phases of the oscillator 400 correspond to the voltages at the nodes $N_1$, $N_2$ and $N_3$. To the oscillation frequency the capacitors $C_1$, $C_2$ or $C_3$ may be decreased and the current source $I_1'$, $I_2'$ and $I_3'$ should be increased.

Figure 4B:
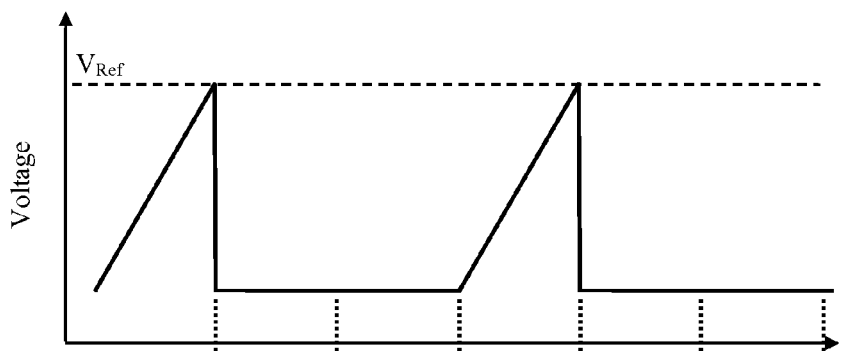
FIGS. 4B-4D shows signal profile at nodes $N_1$, $N_2$ and $N_3$ of FIG. 4A at an oscillation frequency of 50 MHz.
Figure 4C:
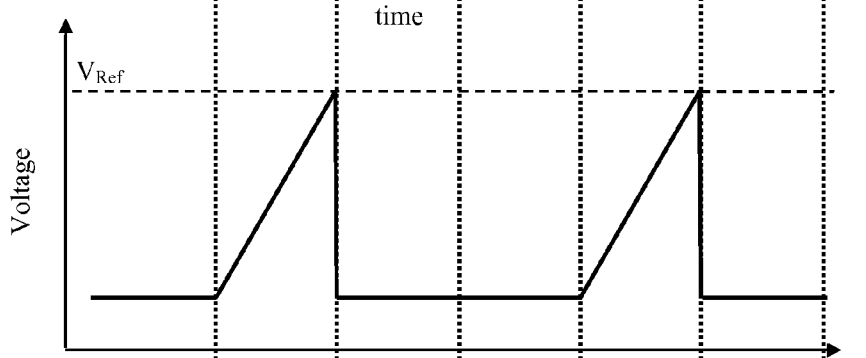
Figure 4D:
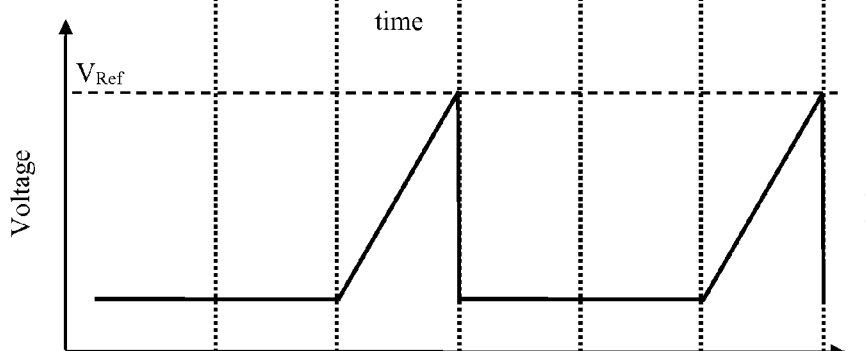
Figure 4E:
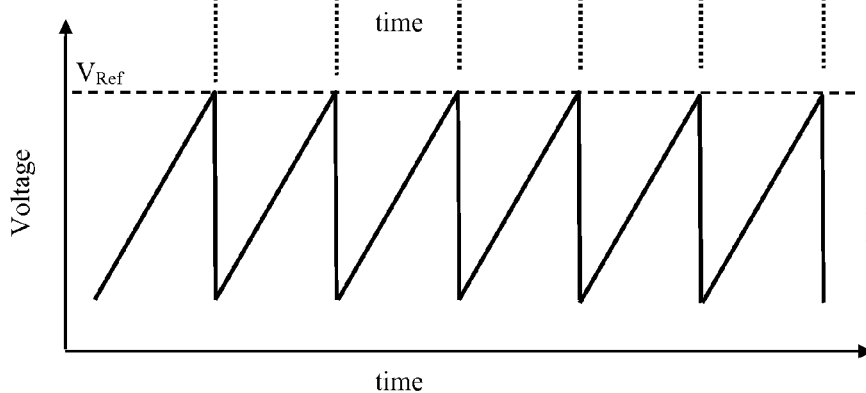
FIG. 4E shows signal profile at nodes $N_1$, $N_2$ and $N_3$ of FIG. 4A at an oscillation frequency higher than 50 MHz.

FIGS. 4B-4D show simulated signal profiles at nodes $N_1$, $N_2$ and $N_3$ in the electrical circuits shown in FIG. 4A. As shown in the figures, the sawtooth waveforms are 120 degrees apart. FIG. 4E shows the sawtooth waveforms of FIGS. 4B-4D superimposed on each other.

Figure 5A:
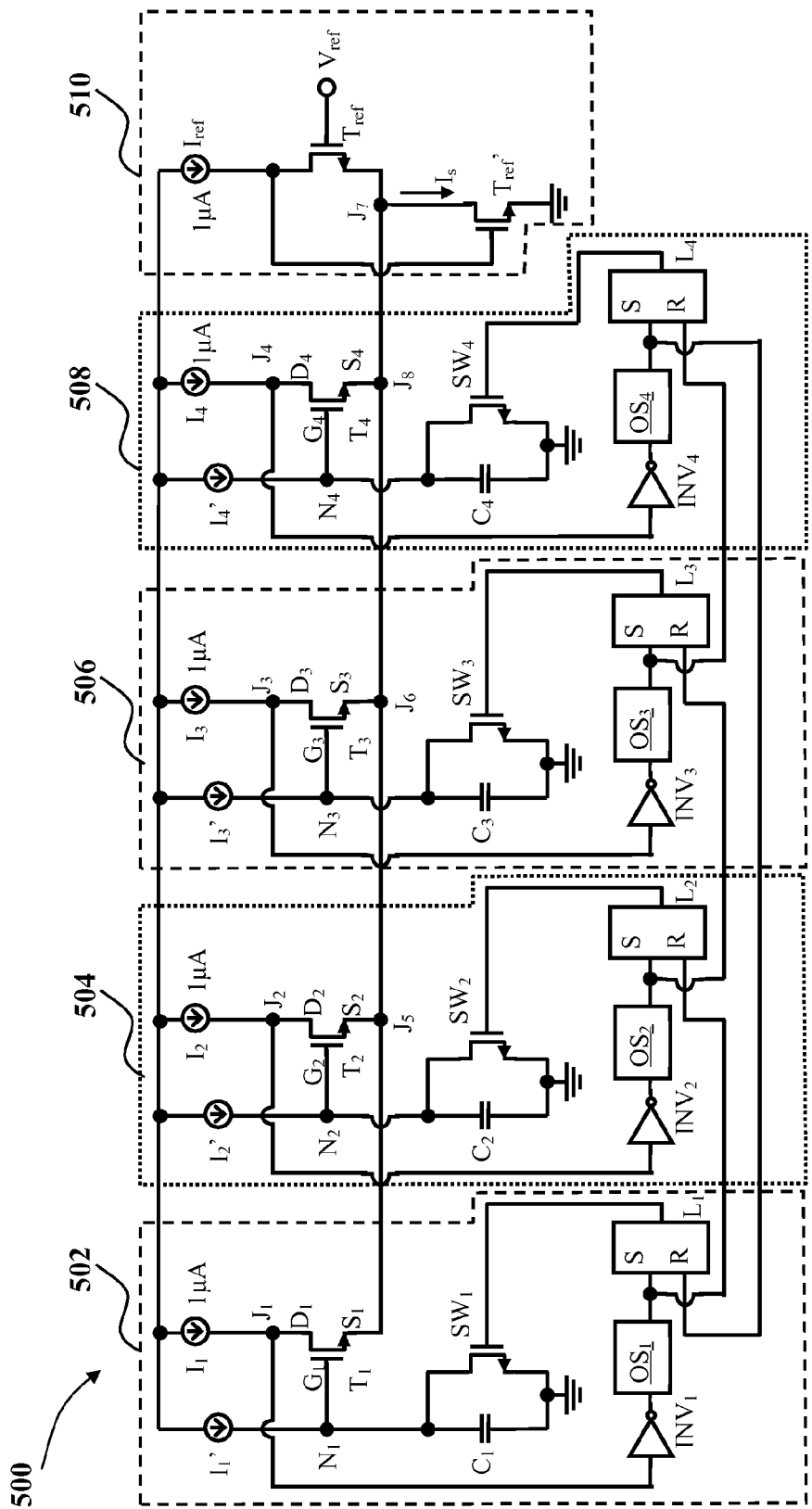
FIG. 5A is a circuit diagram of a four phase oscillator according to an embodiment of the present invention.
Figures 5B, 5C, 5D, 5E, 5F:
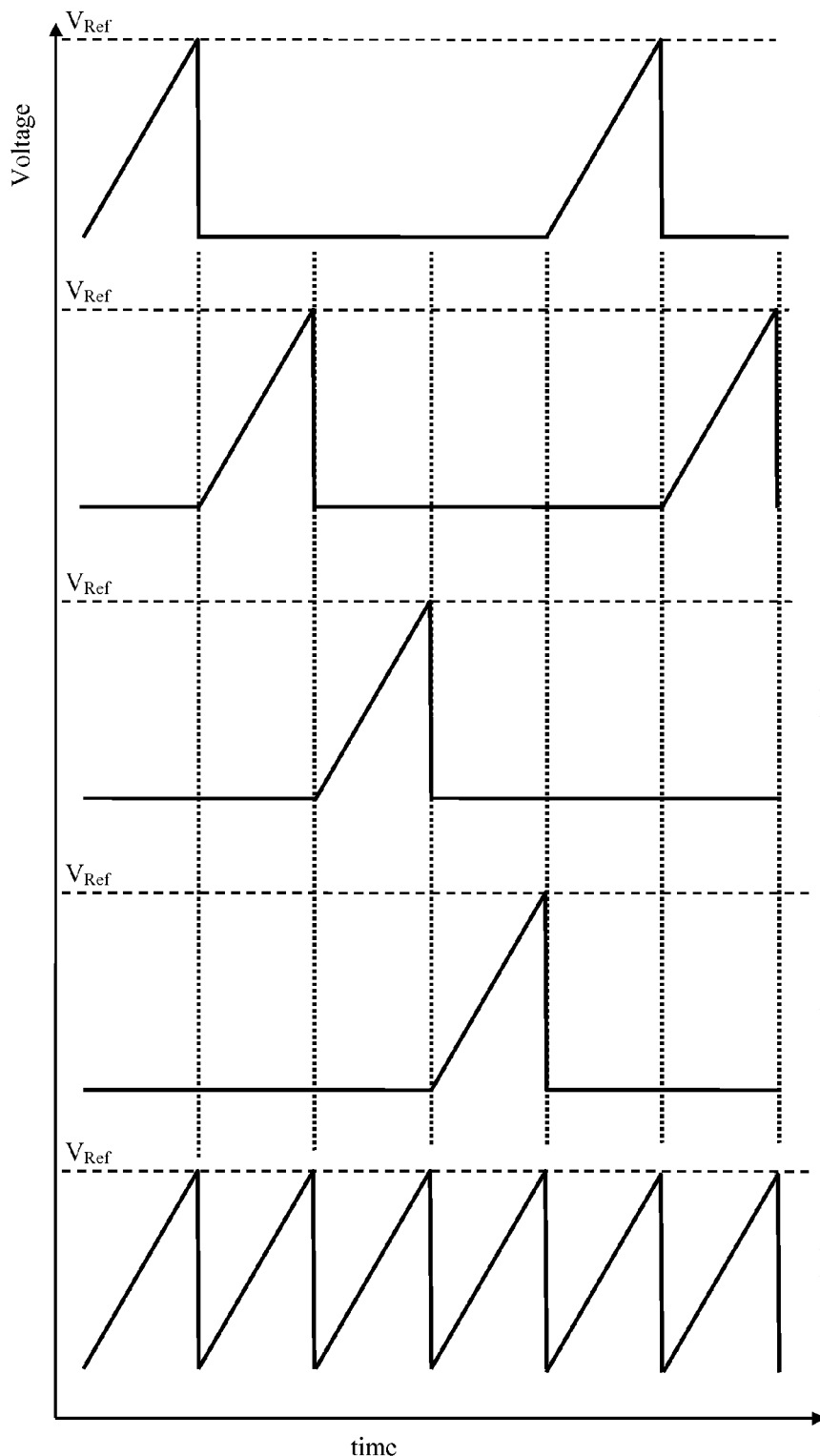
FIGS. 5B-5E shows signal profile at nodes $N_1$, $N_2$, $N_3$ and $N_4$ of FIG. 5A at an oscillation frequency higher than 50 MHz.
FIG. 5F shows signal profile at nodes $N_1$, $N_2$, $N_3$ and $N_4$ of FIG. 5A at an oscillation frequency higher than 50 MHz.

A four phase oscillator may be made by adding another phase module to the circuit of the three phase oscillator of the type depicted in FIG. 4A. FIG. 5A is an electrical diagram illustrating a three phase oscillator 500, which includes four phase stages 502, 504, 506, 508 and one reference stage 510. The reference stage 510 is similar to the reference stage 212 of the oscillator 210 described above in FIG. 2B, which includes two reference transistors $T_{ref}$ and $T_{ref}'$, which may be MOS transistors. The first three phase stages 502, 504, 506 are configured substantially the same as stages 402, 404, and 406 as shown in FIG. 4A with a few minor differences. Specifically, junction $J_6$ of the third reference stage 506 is coupled to a similar junction $J_8$ in the fourth reference stage 508, which is coupled to the junction $J_7$ in the reference stage. Also the output of one-shot timer $OS_3$ is connected to the reset R of latch $L_4$ and the reset R of latch $L_1$ is connected to the output of one-shot timer $OS_4$.

The fourth phase stage 508 may include transistor $T_4$, e.g., a MOS transistor, having a drain $D_4$, a gate $G_4$ and a source $S_4$. The drain $D_4$ is coupled to a current source $I_4$ of, e.g., about 1 uA through a junction $J_4$ The gate $G_4$ is coupled to secondary current source $I_4'$ through a fourth node $N_4$, and the source $S_4$ coupled to the junction $J_8$. The fourth phase stage 508 also includes a capacitor $C_4$, which is generally of equal capacitance to the capacitors $C_1$, $C_2$, $C_3$. The capacitor $C_4$ has a first terminal coupled to the fourth node $N_4$ and a second terminal is connected to the ground. A switch $SW_4$, which can be a MOS transistor, is coupled to the capacitor $C_4$, and includes a source connected to the ground and a gate coupled to an output of a fourth latch $L_4$. The fourth phase stage 508 may further include a fourth inverter $INV_4$ having an input coupled to the current source $I_4$ at the junction $J_4$ and an output coupled to an input of the latch $L_4$. A one-shot timer $OS_4$ may optionally be coupled between the fourth inverter $INV_4$ and the fourth latch $L_4$.

As shown in FIG. 5A, the output of the one-shot timer $OS_2$ is connected to a set S of the latch $L_1$ and a reset R of the latch $L_2$. The output of the one-shot timer $OS_2$ is connected to a set S of the latch $L_2$ and a reset R of the latch $L_3$. The output of the one-shot $OS_3$ is connected to a set S of the latch $L_3$ and a reset R of the latch $L_4$. The output of the one-shot $OS_4$ is connected to a set S of the latch $L_4$ and a reset R of the latch $L_1$. The speed of oscillation of the oscillator 500 is regulated by size of the current from sources $I_1'$, $I_2'$, $I_3'$, $I_4'$ and size of the capacitors $C_1$, $C_2$, $C_3$, and $C_4$.

The reference stage 510 may operate in a manner similar to that described above with respect to FIG. 2B. The reference stage 510 may operate with or without feedback control of the current. In the example shown in FIG. 5A, the second reference transistor $T_{ref}'$ provides negative feedback control of the current through the junction $J_7$ from the transistors $T_1$, $T_2$, $T_3$, $T_4$, and $T_{ref}$ The operation of the oscillator 500 is similar to the operation of the oscillator 400 as described above. At the initial stage, the first switch $SW_1$ is off and the switches $SW_2$, $SW_3$ and $SW_4$ are on. The voltage at the first node $N_1$ ramps up due to the current from the source $I_1'$ until it reaches $V_{ref}$, which pulls the drain $D_1$ of transistor $T_1$ down. This sets the first latch $L_1$ and resets the second latch $L_2$. Therefore, the first switch $SW_1$ turns on and the second switch $SW_2$ turns off.

Similarly, when the voltage at the second node $N_2$ goes above the reference voltage $V_{ref}$ due to the current from the source $I_2'$, the drain $D_2$ of the transistor $T_2$ is pulled down. This sets the second latch $L_2$ and resets the third latch $L_3$. As a result, the second switch $SW_2$ turns on and the third switch $SW_3$ turns off.

When the voltage at the third node $N_3$ goes above the reference voltage $V_{ref}$ due to the current from the source $I_3'$, the drain $D_3$ of the transistor $T_3$ is pulled down. This sets the third latch $L_3$ and resets the fourth latch $L_4$. As a result, the third switch $SW_3$ turns on and the fourth switch $SW_4$ turn off.

When the voltage at the fourth node $N_4$ goes above the reference $V_{ref}$ as a result of the current from the source $I_4'$, the drain $D_4$ of the transistor $T_4$ is pulled down. This sets the fourth latch $L_4$ and resets the first latch $L_1$. As a result, the fourth switch $SW_4$ turns on and the first switch $SW_1$ turn off, which is back to the initial stage.

The four phases can be observed at nodes $N_1$, $N_2$, $N_3$ and $N_4$. To increase frequency of the oscillator, the capacitors $C_1$, $C_2$, $C_3$ or $C_4$ should be decreased and the current sources $I_1'$, $I_2'$, $I_3'$ and $I_4'$ should be increased. The one-shot timers $OS_1$, $OS_2$, $OS_3$, $OS_4$ can provide digital output signals if needed. If the one-shot timers $OS_1$, $OS_2$, $OS_3$, $OS_4$ are not used, the outputs of the inverters $INV_1$, $INV_2$, $INV_3$, $INV_4$ may be directly coupled to the latches.

FIGS. 5B-5E show simulated signal profiles at nodes $N_1$, $N_2$, $N_3$ and $N_4$ in the electrical circuits shown in FIG. 5A at an oscillation frequency of 50 MHz. As shown in the figures, the sawtooth waveforms are 90 degrees apart. FIG. 5F shows the sawtooth waveforms of FIGS. 5B-5D superimposed upon each other.

Oscillators according to embodiments of the present invention as described above may be used for any switching systems. It is estimated that such oscillators can oscillate from very low frequency up to about 50 MHz based on low voltage CMOS process. A faster process will allow faster oscillation frequencies. Another advantage of such oscillators is that they can change their bias current as demand changes during transients. The number of phases can easily be changed as the complexity of the system changes. In addition, the one shot timers and inverters used in the phase modules take up relatively little real estate on a chip. Spread of frequency over the voltage range is only a few percent from 2.5 to 5 volts. Furthermore, the oscillators of the type described above consume low current because a conventional comparator is not required and the reference stage can vary the current as required.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An oscillator apparatus comprising:
    a reference stage having a reference current source $I_{ref}$ and
        a first reference transistor $T_{ref}$ having a gate coupled to a voltage reference $V_{ref}$ and a drain coupled to the reference current source $I_{ref}$; and
        two or more phase stages including a first and a last phase stage, wherein each of the phase stages includes:
            a phase transistor having a drain coupled to a first current source, a gate coupled to a node and a source coupled to a source of the first reference transistor,
            a second current source coupled to the node,
            a capacitor having a first terminal coupled to the node and a second terminal,
            a switch coupled between the first and second terminals of the capacitor, and
            a logic block configured to latch on the switch and turn off the switch for a subsequent phase stage when a voltage at the node exceeds the voltage reference $V_{ref}$.

2. The apparatus of claim 1, wherein each logic block further comprises a set-reset latch and a one-shot timer coupled to the set input of the set-reset latch.

3. The apparatus oscillator of claim 1, wherein the reference stage further comprise a second reference transistor $T_{ref}'$ to provide a negative feedback to detect current need and change a supply current.

4. The apparatus of claim 3 wherein the switch in each phase stage is a field effect transistor.

5. The apparatus of claim 4, wherein the logic block further comprises a set-reset latch and the output of the set-reset latch is coupled to a gate of the switch.

6. The apparatus of claim 1, wherein the switches and transistors are n-channel MOS transistors.

7. The apparatus of claim 6, wherein the source of the switches and the source of the second reference transistor are connected to ground.

8. The apparatus of claim 1 wherein the switches and transistors are p-channel MOS transistors.

9. The apparatus of claim 8, wherein the source of the switches and the source of the second reference transistor are coupled to a voltage V.

10. The apparatus of claim 1 wherein the two or more stages include just the first and last stages, whereby the apparatus is a two phase oscillator.

11. The apparatus of claim 1 wherein the two or more stages include just the first and last stages and an intermediate stage subsequent to the first stage and previous to the last stage, whereby the apparatus is a three phase oscillator.

12. The apparatus of claim 1 wherein the two or more stages include just the first and last stages, a first intermediate stage subsequent to the first stage, and a second intermediate stage subsequent to the first intermediate stage and previous to the last stage, whereby the apparatus is a four phase oscillator.

13. The apparatus of claim 1, wherein the reference stage further includes a current control coupled to the source of the first reference transistor $T_{ref}$, wherein the current control is configured to regulate a total current from the phase transistors and the first reference transistor $T_{ref}$ in a negative feedback mode.

14. The apparatus of claim 13 wherein the current control includes a second reference transistor $T_{ref}'$ having a drain coupled to the source of the first reference transistor, a gate coupled to the drain of the first reference transistor and a source coupled to ground if the second reference transistor $T_{ref}'$ is an N-channel device or to a common voltage if second reference transistor $T_{ref}'$ is a P-channel device.

15. The apparatus of claim 13 wherein the current control includes an operational amplifier.

16. The apparatus of claim 1, wherein the logic block includes an inverter having an input coupled to the drain of the transistor; and
    a set-reset latch having an output coupled to the gate of the switch and a set input coupled to an output of the inverter.

17. The apparatus of claim 16 wherein the output of the inverter in the first stage is coupled to output a reset input of the set-reset latch in the last stage is coupled to the reset input of the set-reset latch in a subsequent stage, wherein the reset input of the set-reset latch in the last stage is coupled to the output of the inverter in a previous stage, and wherein the output of the inverter in the last stage is coupled to a reset input of the set-reset latch in the first stage.

18. A multiphase oscillator comprising:
    a plurality of input stages and a reference stage, each input stage producing a voltage and representing a phase for the oscillator, wherein the plurality of input stages are configured as a maximum selector configured to compare the voltage produced by each input stage to a voltage of the reference stage and select a maximum voltage of the voltages, wherein selection of one of the input stages by the maximum selector causes an output of the selected input stage to change;

a negative feedback loop coupled to the reference stage and configured to detect a current need of the oscillator and provide an appropriate supply current to each input stage.

19. The multiphase oscillator of claim 18 further comprising:
a logic unit which, upon selection of an input stage by the maximum selector, deactivates the selected input stage and activates a next input stage.

20. The multiphase oscillator of claim 18 wherein each input stage includes a transistor and the reference stage includes a reference transistor, wherein the maximum selector compares the voltage on a gate of each input stage's transistor to a voltage at a gate of the reference transistor.

21. The multiphase oscillator of claim 18 wherein the reference stage further comprises:
a fixed current source in series with a first reference transistor, wherein the negative feedback loop is configured to cause the first reference transistor to allow a fixed current value of the fixed current source to pass through the first reference transistor.

* * * * *